(12) United States Patent
Hasei

(10) Patent No.: US 7,282,459 B2
(45) Date of Patent: Oct. 16, 2007

(54) EJECTION METHOD AND OPTICAL DEVICE MANUFACTURING METHOD FOR ARRANGING NOZZLES IN AGREEMENT WITH SECTIONS SUBJECT TO EJECTION

(75) Inventor: Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 471 days.

(21) Appl. No.: 10/941,867

(22) Filed: Sep. 16, 2004

(65) Prior Publication Data

US 2005/0101042 A1 May 12, 2005

(30) Foreign Application Priority Data

Sep. 19, 2003 (JP) ............................. 2003-327989

(51) Int. Cl.
*H01L 21/31* (2006.01)
(52) U.S. Cl. ...................... 438/782; 438/496; 438/584; 438/758; 257/E21.003; 118/52; 118/55; 118/211
(58) Field of Classification Search ................ 438/782, 438/496, 584, 758; 257/E21.003; 118/52, 118/55, 211
See application file for complete search history.

(56) References Cited

U.S. PATENT DOCUMENTS 6,372,285 B2 * 4/2002 Ito et al. ........................ 427/58
6,604,821 B1 8/2003 Akahira et al.
6,736,484 B2 5/2004 Nakamura
2003/0159651 A1 * 8/2003 Sakurada ...................... 118/52
2003/0176005 A1 * 9/2003 Takano et al. ................ 438/48

FOREIGN PATENT DOCUMENTS

| CN | 1167925 A | 12/1997 |
|---|---|---|
| CN | 1425560 A | 6/2003 |
| JP | A 2000-067449 | 3/2000 |

* cited by examiner

*Primary Examiner*—George Fourson
*Assistant Examiner*—Thanh Van Pham
(74) *Attorney, Agent, or Firm*—Oliff & Berridge, PLC

(57) ABSTRACT

Aspects of the invention can provide an ejection method to form a micro lens efficiently on each of a plurality of semiconductor lasers in a wafer state. So that a distance in an x-axis direction between two mutually adjacent sections subject to ejection and a distance between any two nozzles of a plurality of nozzles arranged in the x-axis direction may be in agreement, the ejection method can include a step of positioning a substrate having the two sections subject to ejection, a step of moving relatively the plurality of nozzles along a y-axis direction intersecting the x-axis direction perpendicularly to the substrate, and a step of ejecting a liquid material respectively from the two nozzles to the two sections subject to ejection if the two nozzles should respectively penetrate areas corresponding to the two sections.

9 Claims, 15 Drawing Sheets

RELATED ART

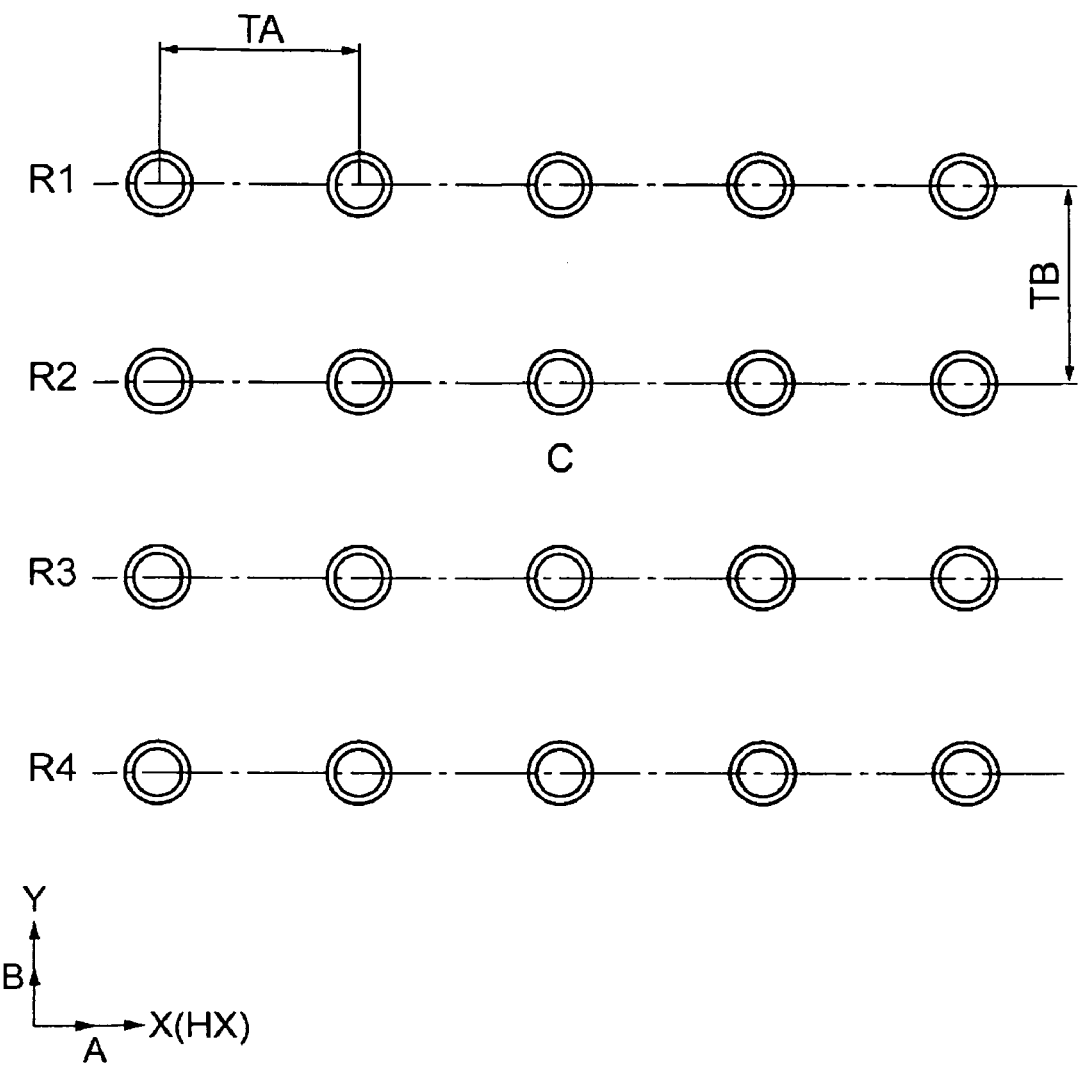
FIG. 9
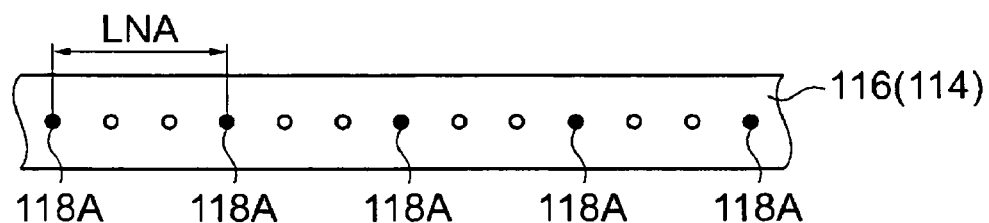

EJECTION METHOD AND OPTICAL DEVICE MANUFACTURING METHOD FOR ARRANGING NOZZLES IN AGREEMENT WITH SECTIONS SUBJECT TO EJECTION

BACKGROUND OF THE INVENTION

1. Field of Invention

The present invention relates to a lens and its manufacturing method, and particularly to a micro lens suitable as a lens of an emitting section of a vertical cavity surface emitting laser, and its manufacturing method.

2. Description of Related Art

Related micro lens can be formed on an emitting surface of the surface light-emitting laser by using an inkjet method. See, for example, Japanese Unexamined Patent Publication No. 2000-67449.

SUMMARY OF THE INVENTION

A plurality of semiconductor lasers are typically formed on a semiconductor substrate in a wafer condition. However, it may occur at times that a distance of two mutually adjacent semiconductors on the wafer is in agreement with a distance between two nozzles on the inkjet device. In such a case, it is not possible to eject a micro lens material from a plurality of nozzles during a period of time in which a head makes one relative movement.

Aspects of the present invention can form a micro lens efficiently on each of the plurality of semiconductor lasers in the wafer condition. An exemplary ejection method according to the invention can include the steps of (A) positioning a substrate having two sections subject to ejection so that a distance in an x-axis direction between the mutually adjacent sections subject to ejection and a gap between any two nozzles of a plurality of nozzles arranged in the x-axis direction may be in agreement; (B) moving the plurality of nozzles along a y-axis direction intersecting perpendicularly the x-axis direction relatively to the substrate; and (C) ejecting a liquid material respectively from the two nozzles to the two sections subject to ejection if the two nozzles should respectively penetrate areas corresponding to the two sections subject to ejection.

According to the above-mentioned characteristics, since there is a step of positioning the substrate having the two sections subject to ejection so that a distance in an x-axis direction between the mutually adjacent sections subject to ejection and a gap between any two nozzles of a plurality of nozzles arranged in the x-axis direction may be in agreement, even if the distance in the x-direction between the mutually adjacent sections subject to ejection should change per substrate, there is no need of changing an angle of attaching a head per substrate. Consequently, even if the distance in the x-direction between the mutually adjacent sections subject to ejection should change per substrate, the material may be ejected to the plurality of sections subject to ejection during a one-time period of scanning. Further, since there is no need to alter the angle of attaching the head per substrate, it is easily applicable to multiple use of substrates.

Preferably, the step (A) can include a step of placing the substrate on a stage and a step of positioning the substrate relative to the plurality of nozzles by rotating the stage. According to the above-mentioned characteristics, since the stage rotates with the substrate, the substrate positioning is made easy.

Further preferably, the step (A) can include further a step of putting the x-coordinates of the two nozzles and the x-coordinates of the two sections subject to ejection in agreement.

As mentioned above, since that the distance in the x-axis direction between the mutually adjacent sections subject to ejection and a gap between any two nozzles of the plurality of nozzles arranged in the x-axis direction may be in agreement, it is possible to eject the material from the plurality of nozzles to the plurality of sections subject to ejection so that a micro lens may be formed efficiently.

Further, aspects of the invention can make it possible to realize a variety of embodiments and may be realized as embodiments, such as a lens manufacturing method and a semiconductor laser fabrication method.

An exemplary ejection device according to the invention can include a head having a plurality of nozzles arrayed in an x-direction, a stage holding a substrate having two mutually adjacent sections subject to ejection, and a scanner changing relative positions of the head and the stage so that the plurality of nozzles move relatively to the substrate along the x-axis direction and a y-axis direction intersecting perpendicularly the x-axis direction. And the scanner can rotate the stage so that a distance in the x-axis direction between the mutually adjacent sections subject to ejection and a gap between any two nozzles of the plurality of nozzles may be in agreement.

According to the above-mentioned characteristics, the scanner rotates the stage so that the distance in the x-axis direction between the mutually adjacent sections subject to ejection and the gap between any two nozzles of the plurality of nozzles may be in agreement. Consequently, the material may be ejected to the plurality of sections subject to ejection during a one-time period of scanning. Also, even if the distance in the x-direction between the mutually adjacent sections subject to ejection should change per substrate, there is no need to alter the angle of attaching the head per substrate, hence, it is easily applicable to multiple use of substrates

BRIEF DESCRIPTION OF THE DRAWINGS

The invention will be described with reference to the accompanying drawings, wherein like numerals reference like elements, and wherein:

FIG. 9 is an exemplary schematic diagram showing an ejection process of Example 1;

DETAILED DESCRIPTION OF PREFERRED EMBODIMENTS

The present will now be described by using a semiconductor laser as an example with reference to the accompanying drawings. It should be understood that the examples shown below do not restrict the contents of the invention described in the claims whatsoever. Also, all the components of the examples below are not necessarily essential to the invention as described in the claims.

Figure 1:
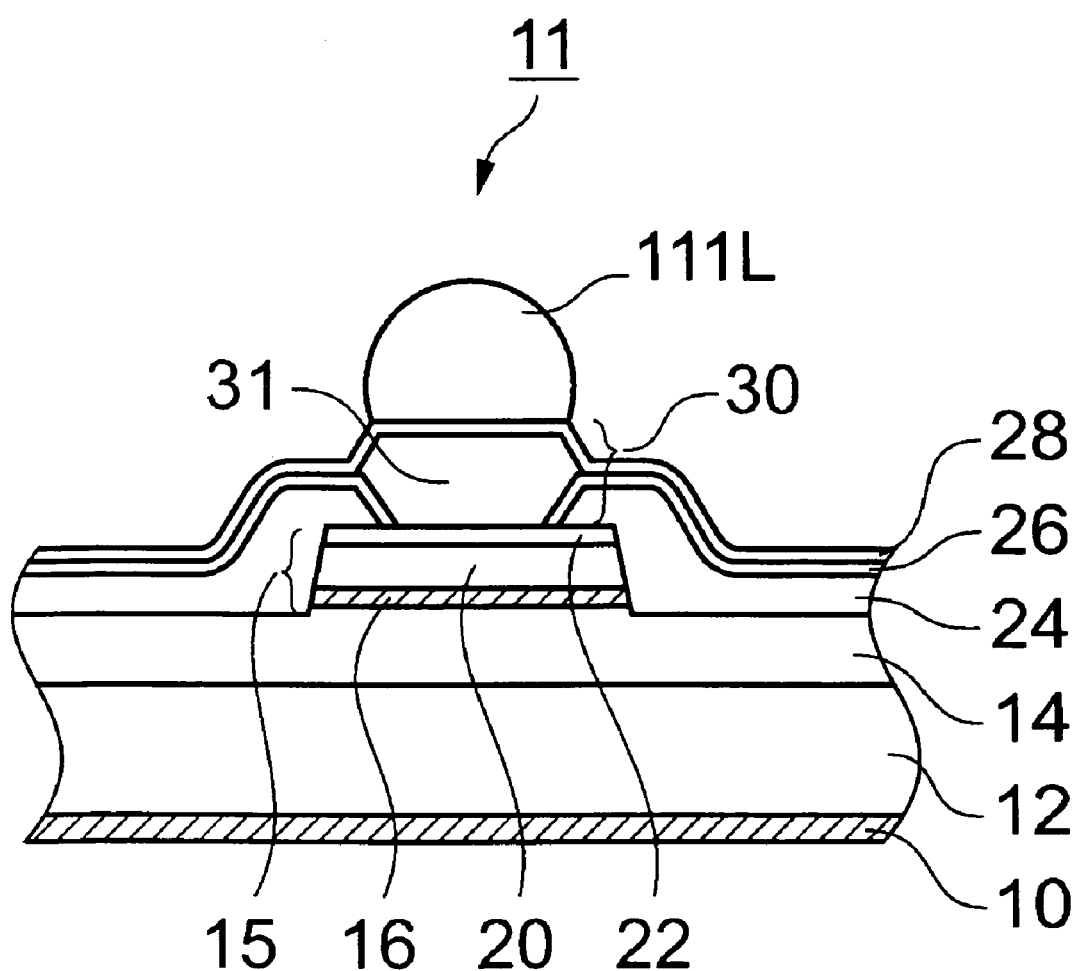
FIG. 1 is an exemplary schematic diagram showing a semiconductor laser of Example 1.

A laser 11 shown in FIG. 1 is a semiconductor laser. The laser 11 includes a n-type gallium arsenic substrate 12, an n-type lower part distribution reflective multi-layer film mirror 14 (also referred to as the lower DBR mirror), a quantum well active layer 16, a p-type upper part distribution reflective multi-layer film mirror 20 (also referred to as the upper DBR mirror), a contact layer 22, an insulating layer 24, an upper electrode 26, a lower electrode 10, a base part 30, and a micro lens 111L. The n-type gallium arsenic substrate 12, the lower part distribution reflective multi-layer mirror 14, the quantum well active layer 16, the upper part distribution reflective multi-layer mirror 20, and the contact layer 22 are stacked in this order. Also, serine (Se) is doped on the lower DBR mirror 14, and zinc (Zn) is doped on the upper DBR 20. Further, part of the lower DBR mirror 14, the quantum well active layer 16, the upper DBR mirror 20, and the contact layer 22 constitute a mesa-shaped columnar part 15.

The insulating layer 23 is composed of polyimide, covering the columnar part 15 and the lower DBR mirror 14 exposed in the periphery of the columnar part 16. The upper electrode 26 can be positioned above the insulating layer 24 and connected to the contact layer 22 through an opening provided on the insulating layer 24. The lower electrode 10 is provided on the reverse surface of the n-type gallium arsenic substrate 12. It should be noted that the reverse surface of the n-type gallium arsenic substrate 12 is a surface on which the lower DBR mirror 14 is not formed.

The base part 30 can include a support 31 including polyimide and a fluoroalkylsilane (FAS) film covering an upper surface of the support 31. The base part 30 is positioned by covering the contact layer 22 and the upper electrode 26 above the contact layer 22. Specifically, the base part 30 covers a difference in height formed by the insulating layer 24 and the upper electrode 26 on the contact layer 22. The upper surface of the base part 30 is substantially flat. In the example, shape of the upper surface of the base part 30 is generally circular.

The fluoroalkylsilane (FAS) film 28 of the base part 30 shows repellency to the liquid optical material which is the raw material of the micro lens 111L. As a result, the liquid optical material ejected to the base part 30 at the time of manufacturing the micro lens 111L is able to stably cover and position itself on the base part 30. In the present example, for reasons of film-making process of the FAS film 28, as shown in FIG. 1, the FAS film 28 is formed not only on the upper surface of the support 31 but also on the upper electrode 26 and the insulating layer 24. It should be noted, however, that the FAS film 28 is sufficient so long as it is provided at least on the upper surface of the support 31, hence, any other FAS film than the FAS film positioned on the support 31 may be removed.

The micro lens 111L is positioned so that it abuts on the FAS film 28 and positions itself as covering the base part 30. The micro lens 111L is an optical element having a function to reduce an angle of radiation of light. To be specific, the angle of radiation of light emitted from the laser 11 equipped with the micro lens 111L is smaller than the angle of radiation of light emitted from the laser 11 not equipped with the micro lens 111L. As described in greater detail below, the fabrication method of the laser 11 equipped with the micro lens 111L can include a step of ejecting a liquid optical material to the section subject to ejection 18 (FIG. 2B) on a substrate 10A.

The laser 11 shown in FIG. 1 is a semiconductor laser emitting a laser beam in a perpendicular direction (upward direction of FIG. 1) to the gallium arsenic substrate 12. In other words, the laser 11 is a vertical cavity surface emitting laser (VCSEL). Specifically, when a voltage is impressed on between the upper electrode 10 and the upper electrode 26 of the laser 11 in forward direction, recombination of an electron and a hole occurs in the quantum well active layer 16, generating recombined emission of light. Light generated therein resonates between the lower DBR mirror 14 and the upper DBR mirror 20, and as a result, intensity of the light is amplified. Then, as light gain exceeds light loss, laser oscillation occurs, emitting a laser beam in a direction perpendicular (upward direction in FIG. 1) to the gallium arsenic substrate 12. The laser beam is emitted from the contact layer 22 through the base part 30 and the micro lens 111L to the outside of the laser 11.

In the present specification, of the laser 11, a section corresponding to the n-type gallium arsenic substrate 12, the n-type lower part distribution reflective multi-layer mirror 14, the columnar part 15, the insulating layer 24, the upper electrode 26, and the lower electrode 10 may be denoted by the laser element. Also, in the present example, the upper surface of the contact layer 22 included in the columnar part 15 may be denoted by the light-emitting surface.

A fabrication method of the laser 11 equipped with the micro lens 111L will be described below in order of (A) the section subject to ejection, (B) a fabrication device, (C) an optical material, (D) an ejection method, and (E) a fabrication method.

A: Section Subject to Ejection

Figure 2A:
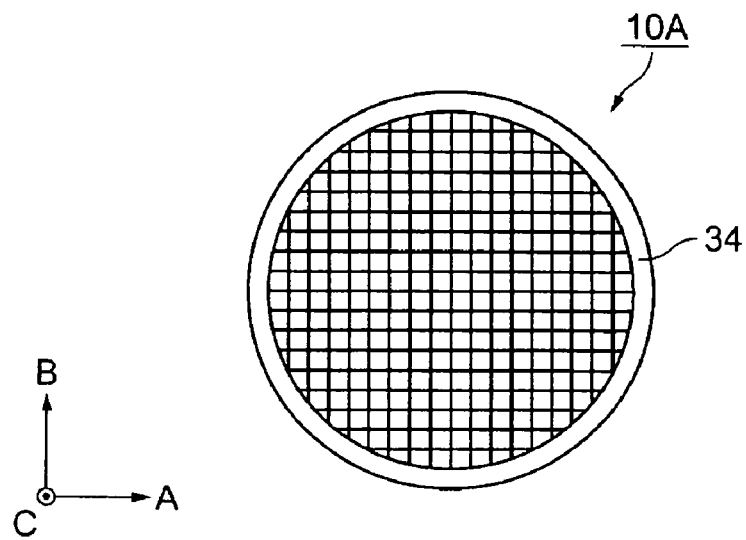
FIG. 2a and b are schematic diagrams showing a substrate of Example 1.
Figure 2B:
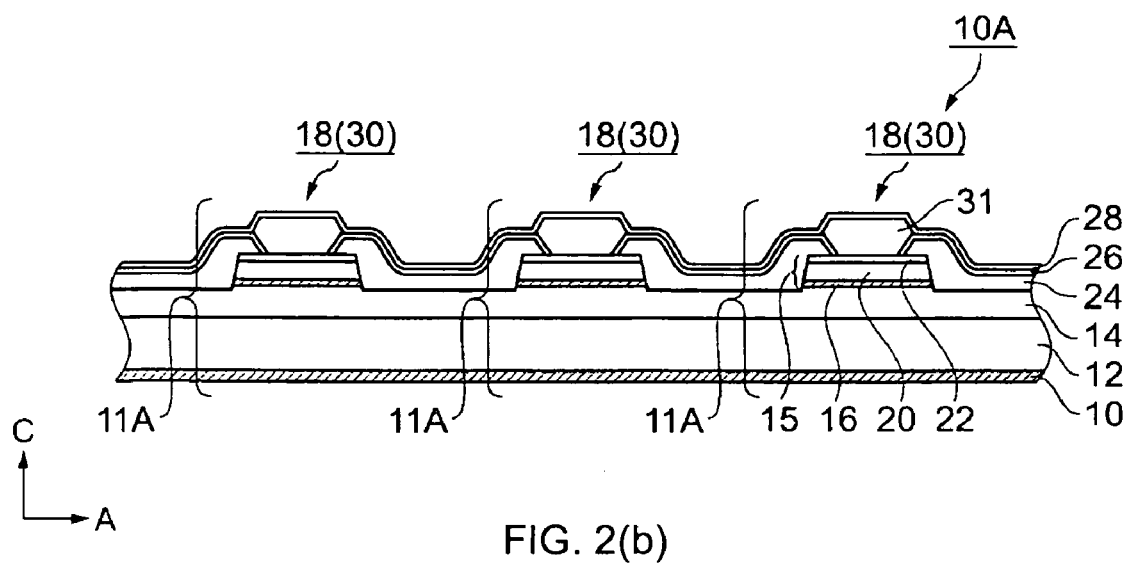

The substrate 10A shown in FIG. 2a and b is a multi-layered matter including the laser 11 prior to the provision of the micro lens 111L of FIG. 1 and being in a circular shape with a diameter of approximately 2 inches.

The substrate 11A is equipped with a plurality of sections subject to ejection, that is, targets. Each of the plurality of sections subject to ejection is a region where the micro lens 111L is to be installed. Also, in the example, the section subject to ejection 18 is the base part 30 provided on the contact layer 22. It should be noted that a gallium arsenic wafer 12' of FIG. 2b corresponds to the gallium arsenic wafer 12 of FIG. 1.

About 8,000 units of laser parts 11A are formed in a matrix manner on the substrate 10A except for a periphery 34 which is approximately 3 mm wide. Structure of each part 11A is the same structure as the laser 11 of FIG. 1 except for lack of the micro lens 111L.

B: Fabrication Device

Figure 3:
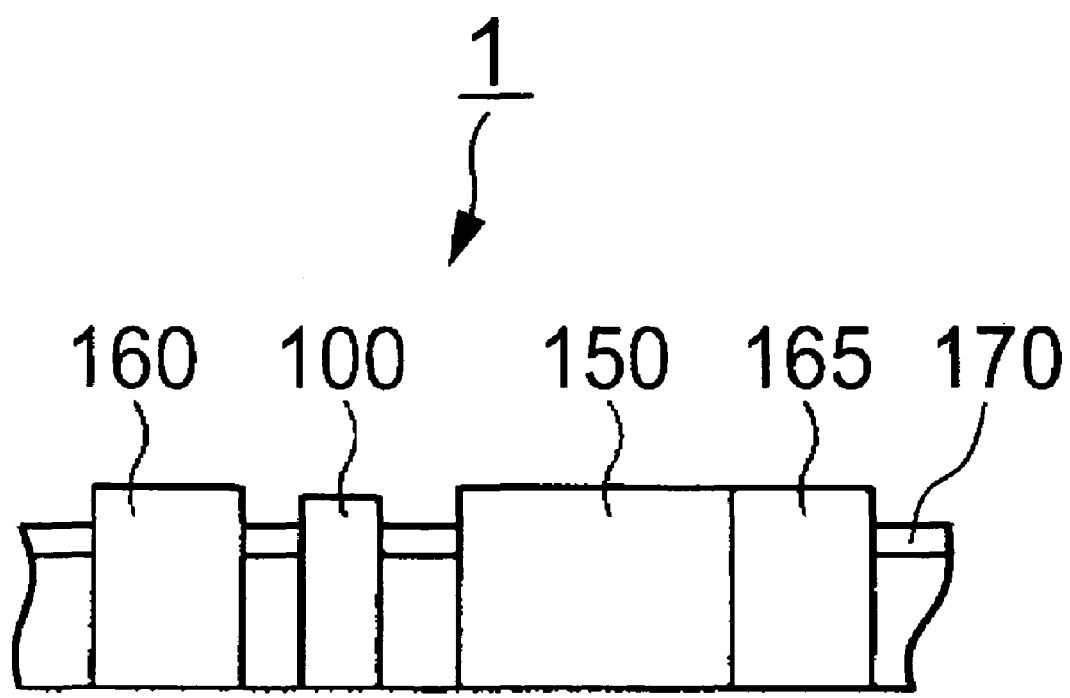
FIG. 3 is an exemplary schematic diagram showing a fabrication device of Example 1.

A fabrication device 1 shown in FIG. 3 is part of an apparatus shown in FIG. 1 to fabricate the laser 11. Specifically, the fabrication device 1 can include a surface quality improvement device 160 forming the FAS film 28 on the surface of the substrate 10A, an ejection device 100 for coating a liquid optical material 111 on all the plurality of the sections subject to ejection, a polymerization unit 150 irradiating an ultraviolet ray on the liquid optical material 111 on the sections subject to ejection so that the liquid optical material 111 coated on the sections subject to ejection may polymerize, and a hardening unit 165 for further hardening by heating the polymerized optical material. Further, the fabrication device 1 comprises a conveying unit 170 to convey the substrate 10A in the order of the surface quality improvement device 160, the ejection device 100, the polymerization unit 150, and the hardening unit 165.

Figure 4:
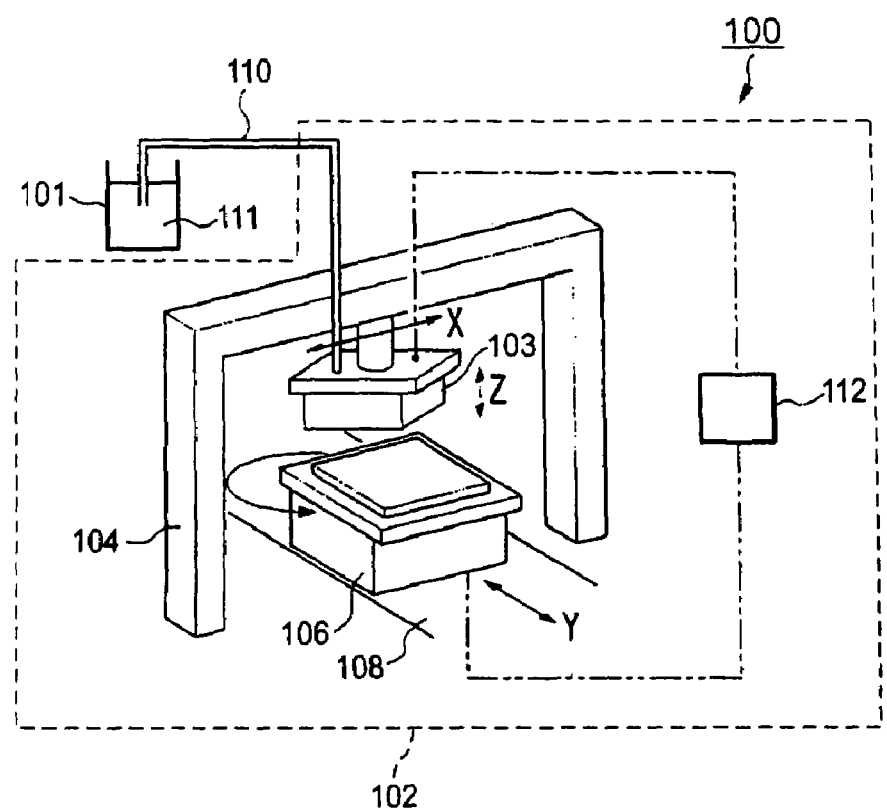
FIG. 4 is an exemplary schematic diagram showing an ejection device of Example 1.

As shown in FIG. 4, the ejection device 100 can include a tank 101 to hold the liquid optical material 111 and an ejection scanning part 102 to supply the optical material 111 from the tank 101 through a tube 110. The ejection scanning part 102 can have a carriage 103 having a plurality of heads 114 (FIG. 5), each capable of ejecting the optical material 111, a first position control 104 controlling a position of the carriage 103, a stage 106 holding the substrate 10A, a second position control 108 controlling a position of the stage 106, and a control 112. The tank 101 and the plurality of heads 114 are linked by the tube 110, and the liquid optical material 111 is supplied from the tank 101 to each of the plurality of heads 114 by compressed air.

The first position control 104 is equipped with a linear motor, moving the carriage 103 along the x-direction and the z-axis direction intersecting the x-axis direction perpendicularly in response to a signal from the control 112. The second position control 108 is equipped with a linear motor, moving the stage 106 along the y-axis direction intersecting both the x-axis direction and the z-axis direction perpendicularly in response to a signal from the control 112. The stage 106 has a plane parallel to both the x-axis direction and the y-axis direction with configuration such that the substrate 10A may be affixed onto this plane. Since the stage 106 affixes the substrate 10A, the stage 106 may determine a position of the section subject to ejection 18. It should be noted that the substrate 10a of this example is an example of an accommodative substrate.

The second position control 108 further has a function of rotating the stage 106 through a specified axis rotation parallel to the z-axis direction. The z-axis direction is a direction parallel to the z-axis direction (that is, direction of acceleration of gravity). The z-axis direction is a direction parallel to the perpendicular direction. Through rotation due to axis revolution parallel to the z-axis direction of the stage 106 by the second position control 108, it is possible to put the a-axis and the b-axis in the coordinate system affixed onto the substrate 10A respectively parallel to the x-axis direction and the y-axis direction. In the present example, the x-axis direction and the y-axis direction are both the directions in which the carriage makes relative movement to the stage 106.

In the present specification, the first position control 104 and the second position control 108 may be denoted by the scanning unit.

Further, it is possible to determine the position of the substrate 10A having the section subject to ejection 18 so that through rotation of the stage 106 due to axis revolution parallel to the z-axis by the second position control 108, a distance between mutually adjacent two sections subject to ejection 18 in the x-axis direction and a distance between any two nozzles of the plurality of nozzles (FIG. 6) in the x-axis direction may be in agreement.

The carriage 103 and the stage 106 further have a freedom of parallel movement and rotation other than the above-mentioned. It should be noted, however, that in the example, description of freedom other than the above-mentioned freedom is omitted for the sake of simplifying description.

The control 112 is configured so that ejection data indicating the relative position to which the optical material 111 is to be ejected may be received from an external information processor. The detailed function of the control 112 will be described in detail below.

Figure 5:
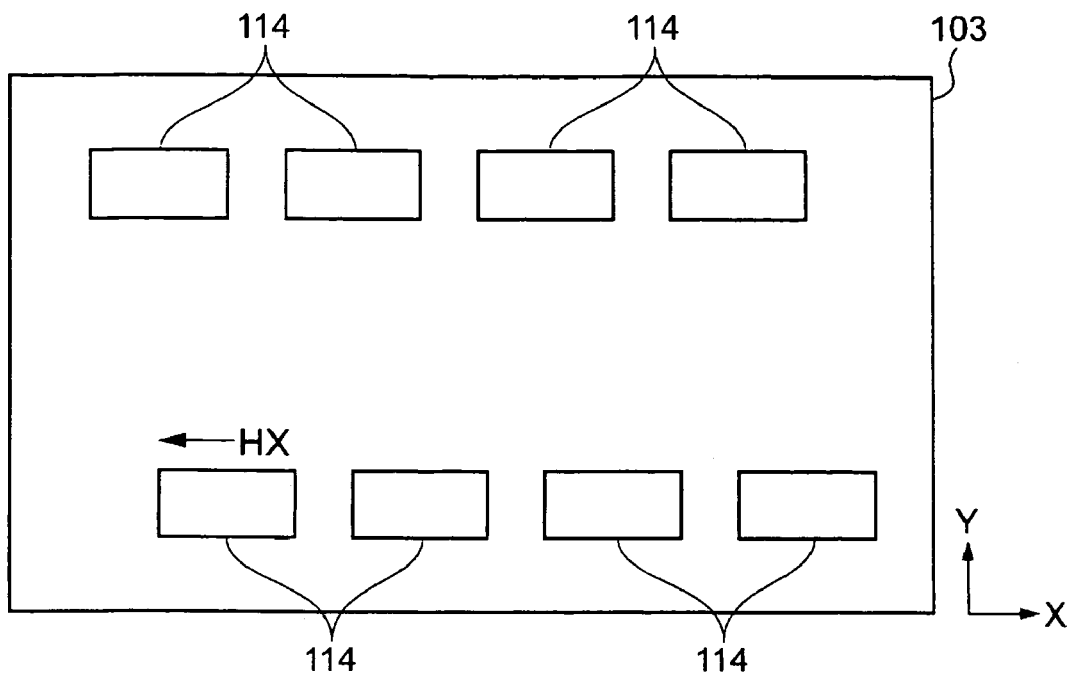
FIG. 5 is an exemplary schematic diagram showing a carriage of Example 1.

As show in FIG. 5, the carriage 103 holds a plurality of heads 114 mutually having the same structure. FIG. 5 is a diagram of a view of the carriage 103 from the stage 106 side. Consequently, a direction perpendicular to the drawing is the z-axis direction. In the example, there are arrayed in the carriage 103 two rows, each consisting of four heads 114. Each of the heads 114 is affixed to the carriage 103 so that an angle AN between the length direction and the x-axis direction of each head 114 may be 0°.

Figure 6:
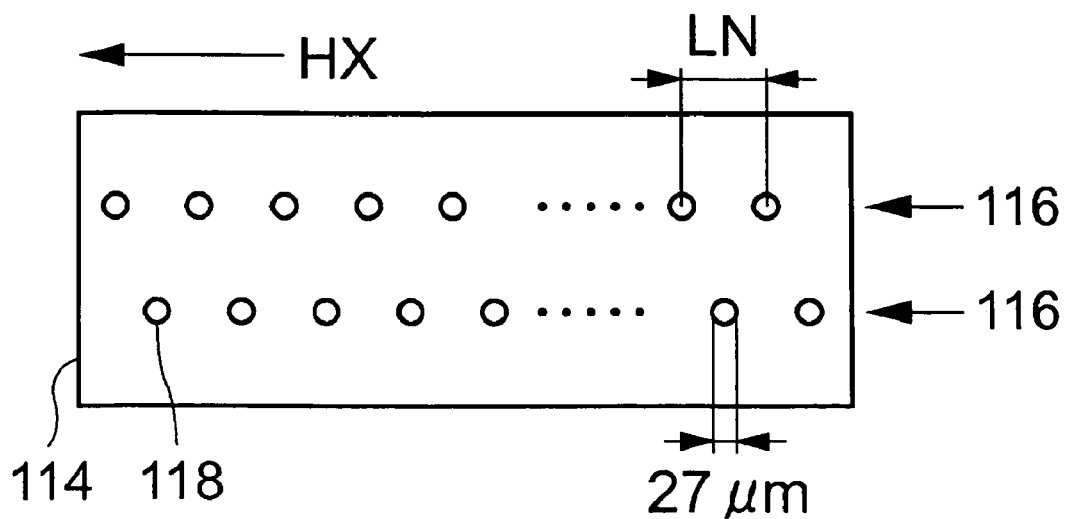
FIG. 6 is an exemplary schematic diagram showing a head of Example 1.

As shown in FIG. 6, each of the heads 114 for ejecting the optical material 111 has two rows of nozzles 116 extending in the length direction of the heads 114. A nozzle row 116 means a row in which 180 nozzles 118 are arrayed in a line at a substantially fixed interval. A direction of the nozzle row 116 is denoted by nozzle row direction HX. An interval of the nozzles 118 along the nozzle row direction HX is LN (approx. 140 µm). Also, in FIG. 6, two nozzle rows 116 at one head 114 are positioned half a pitch (approx. 70 µm) discrepant from each other. Further, diameter of the nozzle 118 is approx. 27 µm. As described above, since the angle between the head 114 in the length direction and the x-axis direction is the angle AN, the nozzle row direction HX, that is, an angle between a direction in which the 180 nozzles 118 are arrayed in one line and the x-axis direction is also the angle AN or 0°.

It should be noted that an end of each of the plurality of nozzles 118 is positioned on a virtual plane defined by the x-axis direction and the y-axis direction. Also, each shape of the plurality of nozzles 118 is adjusted so that the head 114 may be able to eject the material substantially in parallel to the z-axis direction.

Figure 7A:
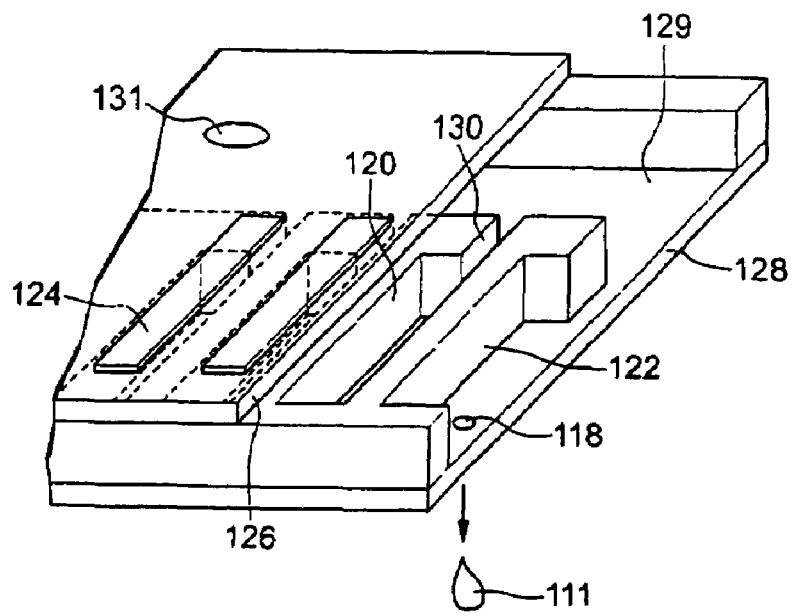
FIG. 7a and b are schematic diagrams showing an ejector of Example 1.
Figure 7B:
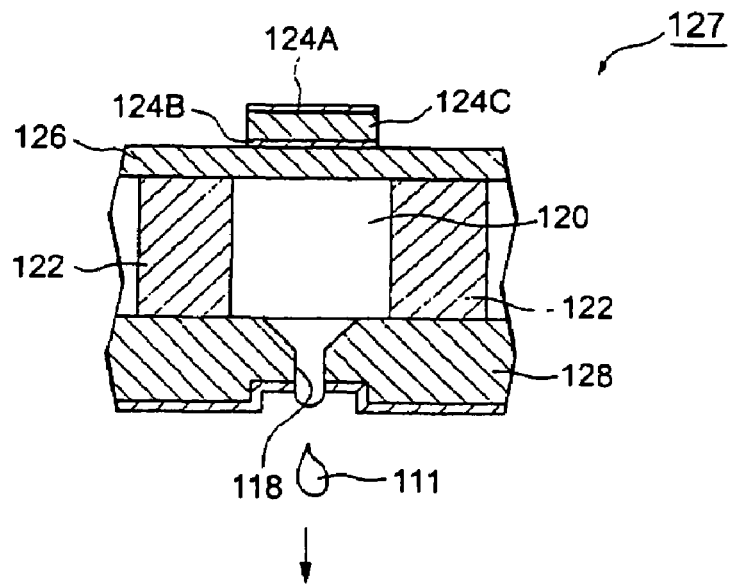

As shown in FIGS. 7a and b, each head 114 is an inkjet head. To be more specific, each head 114 is composed of a vibrating plate 126 and a nozzle plate 128. In between the vibrating plate 126 and the nozzle plate 128, there is positioned a liquid reservoir 129 which is filled at all times with the liquid optical material 111 supplied from the tank 101 through a hole 131. Also, in between the vibrating plate 126 and the nozzle plate 128, there are positioned a plurality of bulkheads. And a portion surrounded by the vibrating plate 126, the nozzle plate 128, and a pair of bulkheads 122 is a cavity 120. Since the cavity 120 is provided to correspond to the nozzle 118, the number of the cavities 120 and the number of the nozzles 118 are the same. To the cavity 120 is supplied the optical material 111 from the liquid reservoir 129 through a supply port 130 located between the pair of the bulkheads 122.

On the vibrating plate 126, there is positioned a vibrator 124 corresponding to each cavity 120. The vibrator 124 includes a piezo-electric element 124C and a pair of electrodes 124A and 124B grasping the piezo-electric element 124C. By impressing a drive voltage on this pair of the electrodes 124A and 124B, the liquid optical material 111 is ejected from the corresponding nozzle 118.

The control 112 (FIG. 4) is configured such as to give a mutually independent signal to each of a plurality of vibrators 124. As a result, volume of the optical material 111 ejected from the nozzle 118 is controlled per nozzle 118 in response to a signal from the control 112. Further, the volume of the optical material 111 ejected from each of the nozzles 118 is variable between 0 pl and 42 pl (picoliter). Consequently, as mentioned later, it is possible for the control 112 to set a nozzle 118 which performs ejection and a nozzle 118 which does not perform ejection.

In the present specification, the nozzle 118 performing ejection may be denoted by the first nozzle 118A, or the operating nozzle 118. Also, the nozzle 118 not performing ejection may be denoted by the second nozzle 118A, or the non-operating nozzle 118.

In the present specification, a portion including one nozzle 118, the cavity 120 corresponding to the nozzle 118, and the vibrator 124 corresponding to the cavity 120 may be denoted by an ejector 127. According to this denotation, one head 114 has the same number of the ejectors 127 as the number of the nozzles 118. In the present example as mentioned above, the carriage 103 holds the head 114. On the other hand, each of the heads 114 has a plurality of ejectors 127. As a result, in the present specification, it may be denoted so that the carriage 103 holds a plurality of ejectors 127.

The ejector 127 may have an electric heat conversion element instead of a piezo-electric element. Namely, the ejector may be configured so that a material is ejected by using thermal expansion of the material due to the electric heat conversion element.

As mentioned above, the carriage 103 is moved by the first position control 104 (FIG. 4) in the x-axis direction and in the z-axis direction. On the other hand, the stage 106 (FIG. 4) is moved by the second position control 108 (FIG. 4) in the y-axis direction. As a result, the carriage 103 moves relatively to the stage 106 by the first position control 104 and the second position control 108. To be more specific, as a result of these movements, a plurality of heads 114, a plurality of nozzle rows 116 or a plurality of nozzles 118 move relatively to the section subject to ejection 18 positioned on the stage 106 in the x-axis direction and the y-axis direction wile maintaining a specified distance in the z-axis direction, that is, scan relatively. To be further specific, the head 114 scans relatively to the stage in the x-axis direction and the y-axis direction, while, at the same time, ejecting the material from the plurality of nozzles 118.

In the invention, the nozzle 118 may be moved in the y-axis direction relative to the section subject to ejection 18 staying stationary to the ejection device 100, and the optical material 111 may be ejected from the nozzle 118 relative to the section subject to ejection 18 staying stationary, during a period of time in which the nozzle 118 moves between the specified two points along the y-axis direction. Relative scanning or relative movement includes scanning at least one side relative to the other side, where there are an ejecting side and a side to which ejection therefrom impacts (section subject to ejection 18R side). As a result, in the present specification, even when the carriage 103, the head 114 or the nozzle 118 remains stationary relative to the ejection device 100 so that only the stage 106 moves, it is denoted that the carriage 103, the head 114 or the nozzle 118 moves relatively to the stage 108, the substrate 10A or the section subject to ejection 18. Also, a combination of relative scanning and ejection of the material may be denoted by coat scanning.

Figure 8:
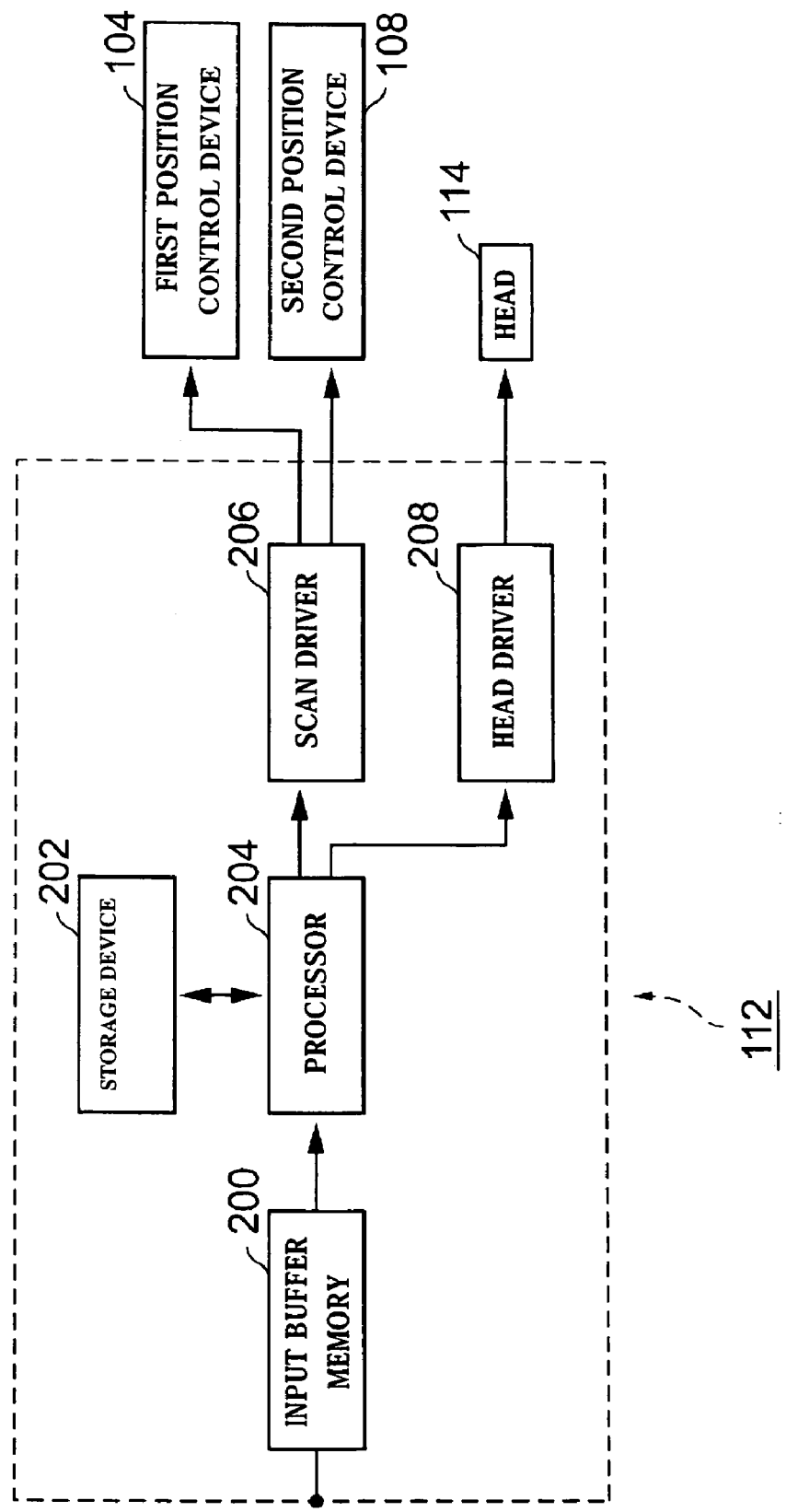
FIG. 8 is a functional block diagram of a control in an ejection device.

Next, configuration of the control 112 will be described. As shown in FIG. 8, the control 112 can include an input buffer memory 200, a storage device 202, a processor 204, a scan driver 206, and a head driver 208. The buffer memory 202 and the processor 204 are mutually connected communicably. The processor 204 and the scan driver 206 are mutually connected communicably. The processor 204 and the scan driver 206 are mutually connected communicably. The processor 204 and the head driver 208 are mutually connected communicably. Also, the scan driver 206 is mutually connected communicably to the first position control means 104 and the second position control means 108. Likewise, the head driver 208 is mutually connected communicably to each of the plurality of heads 114.

The input buffer memory 200 receives from the external information processor ejection data for ejecting the optical material 111. The ejection data comprise data on relative positions of all the sections subject to ejection 18 on the substrate 10A, data on the number of times of relative scanning needed until a desired thickness of the optical material 111 is coated on all the sections subject to ejection 18, data on the impact positions on the sections subject to ejection 18, data on specifying the nozzles 118 which perform ejection, and data on specifying the nozzles 118 which do not perform ejection. The input buffer memory 200 supplies the ejection data to the processor 204, and the processor 204 stores the ejection data in the storage device 202. In FIG. 8, the storage device 202 is a RAM.

The processor 204, based on the ejection data in the storage device 202, provides to the scan driver 206 data on the relative position of the nozzle row 116 to the section subject to ejection 18. The scan driver 206 gives a drive signal corresponding to these data to the first position control device 104 and the second position control device 108. As a result, the nozzle row 116 is subjected to scanning with respect to the section subject to ejection 18R. On the other hand, the processor 204, based on the ejection data in the storage device 202, provides to the head driver 208 data on ejection timing of the corresponding nozzle row 116. The head driver 208, based on the data, provides to the head 114 the drive signal needed for ejecting the optical material 111. Consequently, the liquid optical material 111 is ejected from the corresponding nozzle 118 of the nozzle row 116.

The control 112 may be a computer including a CPU, a ROM, and a RAM. In this case, the above-mentioned function thereof is realized by a software program executed by the computer. Naturally, the control 112 may be realized by an exclusive circuit (hardware).

By the foregoing configuration, the ejection device 100R performs coat scanning of the optical material 111 according to the ejection data provided by the control 112.

C: Optical Material

The liquid optical material 111 of the example is an example of liquid optical materials. A liquid material stands for a material having a viscosity which enables it to be ejected from the nozzle 118. In this case, it does not matter whether the material is aqueous or oil-based. So long as it has a fluidity (viscosity) that enables ejection from the nozzle 118, it is sufficient. Even though a solid substance is mixed, if it is a fluid matter as a whole, it is adequate.

Further, the optical material 111 of the example contains a non-solvent resin. The non-solvent resin is a resin that becomes a fluid matter without dissolving it by using an organic solvent. For example, if the non-solvent resin is diluted with its monomer, condition of the non-solvent resin becomes a liquid state. Specifically, when the non-solvent resin is diluted with its monomer, the non-solvent type resin becomes a fluid matter having a viscosity that enables ejection from the nozzle 118 of the ejection device 100.

As the above-mentioned resins of the non-solvent type, there are used acrylic resins, such as polymethylmethacrylate, polyhydroxyethyl methacrylate, and polycyclohexylmethacylate, aryl resins such as polyethyleneglycolbisarylcarbonate, and polycarbonate, and resins such as mathacryl resin, polyurethane resin, polyester resin, polyvinyl chloride resin, polyvinylacetate resin, cellulose resin, polyamide resin, fluororesin, polypropylene resin, and polystyrene resin.

The optical material 111 of the example contains any one of, or a mixture of a plurality of the foregoing non-solvent resins. Further, a photopolymerization initiator such as a biimidazole compound is blended in the optical material 111 of the present example. Since the initiator for photopolymerization is blended, when a visible ray, an ultraviolet ray, a far ultraviolet ray, an x-ray or an electron beam, or the like is irradiated to the liquid optical material 111 under a specified condition, the liquid optical material 111 generates a polymerization reaction and hardens. In the present specification, such liquid optical material 111 of the present example may be denoted by the radiation hardening resin.

D: Ejection Method

Next, an ejection method whereby the ejection device 100 ejects the liquid optical material 111 onto the section subject to ejection 18 of the substrate 10A, namely, the ejection process will be described.

First, the conveying unit 170 positions the substrate 10A on the stage 106 of the ejection device 100. In the example, the conveying unit 170 places the substrate 10A on the stage 106 so that the a-axis direction and the b-axis direction are respectively in agreement with the x-axis direction and the y-axis direction. As mentioned above, it should be noted that the a-axis direction and the b-axis direction are in the directions mutually intersecting perpendicularly, showing the coordinate system affixed to the substrate 10A. On the other hand, the x-axis direction and the y-axis direction are in the directions mutually intersecting perpendicularly, which are the directions for the carriage 103, the head 114, the nozzle row 116 or the nozzle 118 to move relatively to the stage 106. In the example, the x-axis direction is a direction parallel to the direction in which a plurality of nozzles 118 are arrayed, that is, the nozzle row direction HX.

As shown in FIG. 9, a column direction (transverse direction of FIG. 9) of the section subject to ejection 18 is parallel to the A-axis direction. On the other hand, a row direction (vertical direction of FIG. 9) of the section subject to ejection 18 is parallel to the B-axis direction. A distance between the two mutually adjacent sections subject to ejection 18 in the A-axis direction is TA. Also, a distance between the two mutually adjacent sections subject to ejection 18 in the B-axis direction is TB. In FIG. 9, there are illustrated a column R1, a column R2, a column R3, and a column R4, each including five sections subject to ejection 18.

Next, the control 112 designates at least two nozzles from a plurality of nozzles 118 included in the nozzle row 116 to function as the first nozzle 118A, that is, the operating nozzle. In the example, several nozzles from a plurality of nozzles 118 are selected as the first nozzles 118 such that a distance between the closest two first nozzles 118 be LNA under TA. In the example of FIG. 9, the first nozzles 118A are the farthest left nozzle 118, the fourth nozzle 118 from the left, the seventh nozzle 118 from the left, the fourth nozzle 118 from the right, and the farthest right nozzle 118, as indicated by black dots. Between the two first nozzles 118 are positioned the two second nozzles 118B, as indicated by white dots.

In this manner, one nozzle 118 from the three nozzles 118 is designated as the first nozzle 18A. According to this setting method of the first nozzle 118A, since there are 180 nozzles 118 in one nozzle row 116, 60 first nozzles 118A are designated in one nozzle row 116.

Next, the control 112 rotates the stage 106 so that a distance between the two mutually adjacent sections subject to ejection 18 along the x-axis direction may be in agreement with a distance between the two first nozzles 118A. In the present example, since the distance between the two mutually adjacent sections subject to ejection 18 along the a-axis direction is TA, it is only necessary to rotate the stage 106, for example, with a point C as a center, by an angle φ=Arc cosine (LNA/TA) from a position in an x-y plane shown in FIG. 9 counterclockwise. Then, the distance in the x-axis direction between the two mutually adjacent sections subject to ejection 18 along the a-axis direction is in agreement with the distance between the first nozzles 18A (that is, LNA). It should be noted that the distance in the x-axis direction is a component in the x-axis direction of the distance between the two points.

Figure 10:
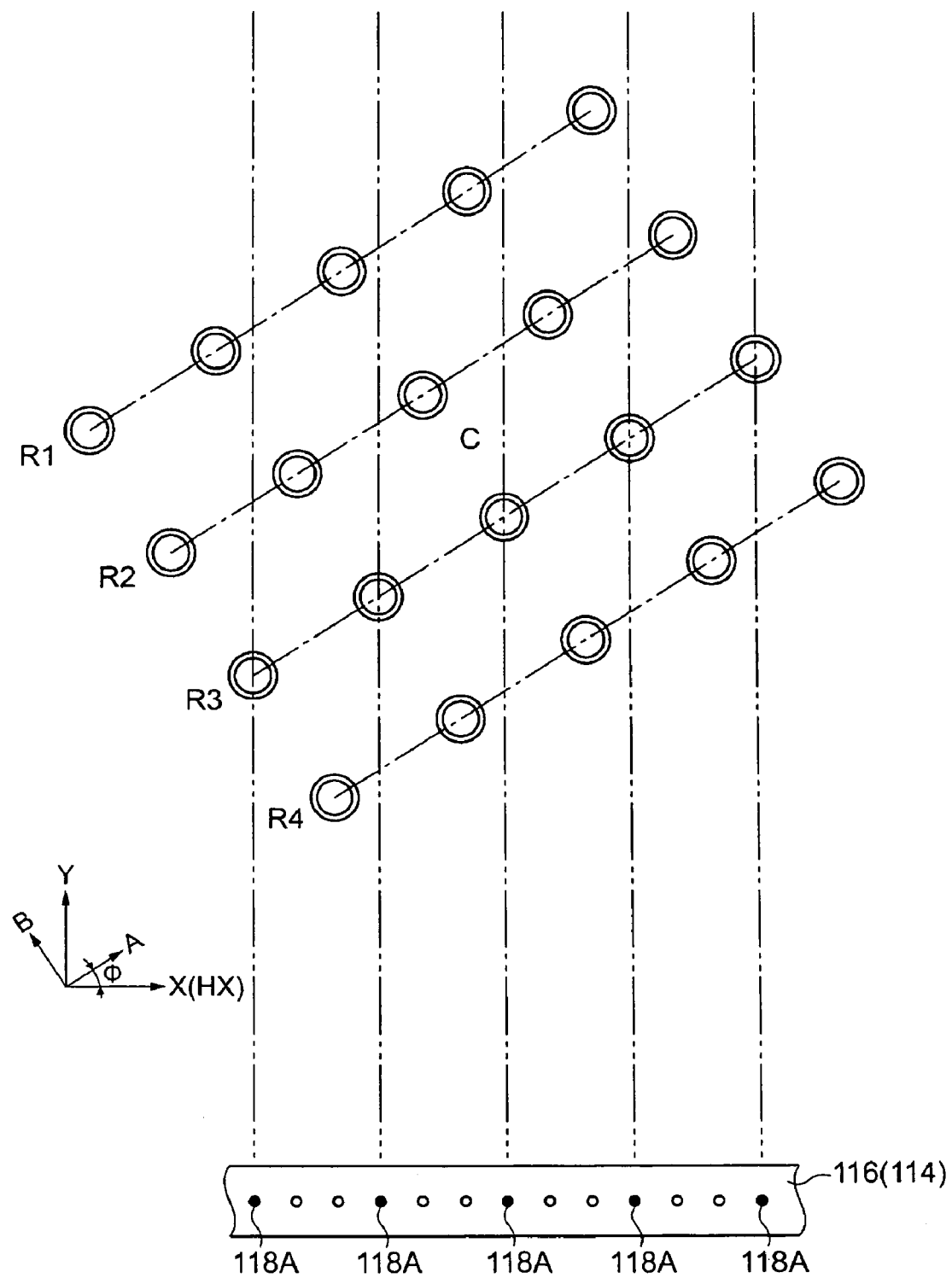
FIG. 10 is an exemplary schematic diagram showing an ejection process of Example 1.

Next, as shown in FIG. 10, the control 112 moves the carriage 103 along the x-axis direction relatively to the stage 106 so that the x-coordinate of the first nozzle 118A is in agreement with the x-coordinate of the section subject to ejection 18. For example, the control 112 drives the scanner so that the x-coordinate of any one of the nozzles 118A of the first nozzles 118 shown in FIG. 10 agrees with the x-coordinate of any one of the sections subject to ejection 18 included in the column R3. By this, the x-coordinates of other first nozzles 118A included in the nozzle row 116 agree with the x-coordinates of other sections subject to ejection 18 of the column R3.

Figure 14:
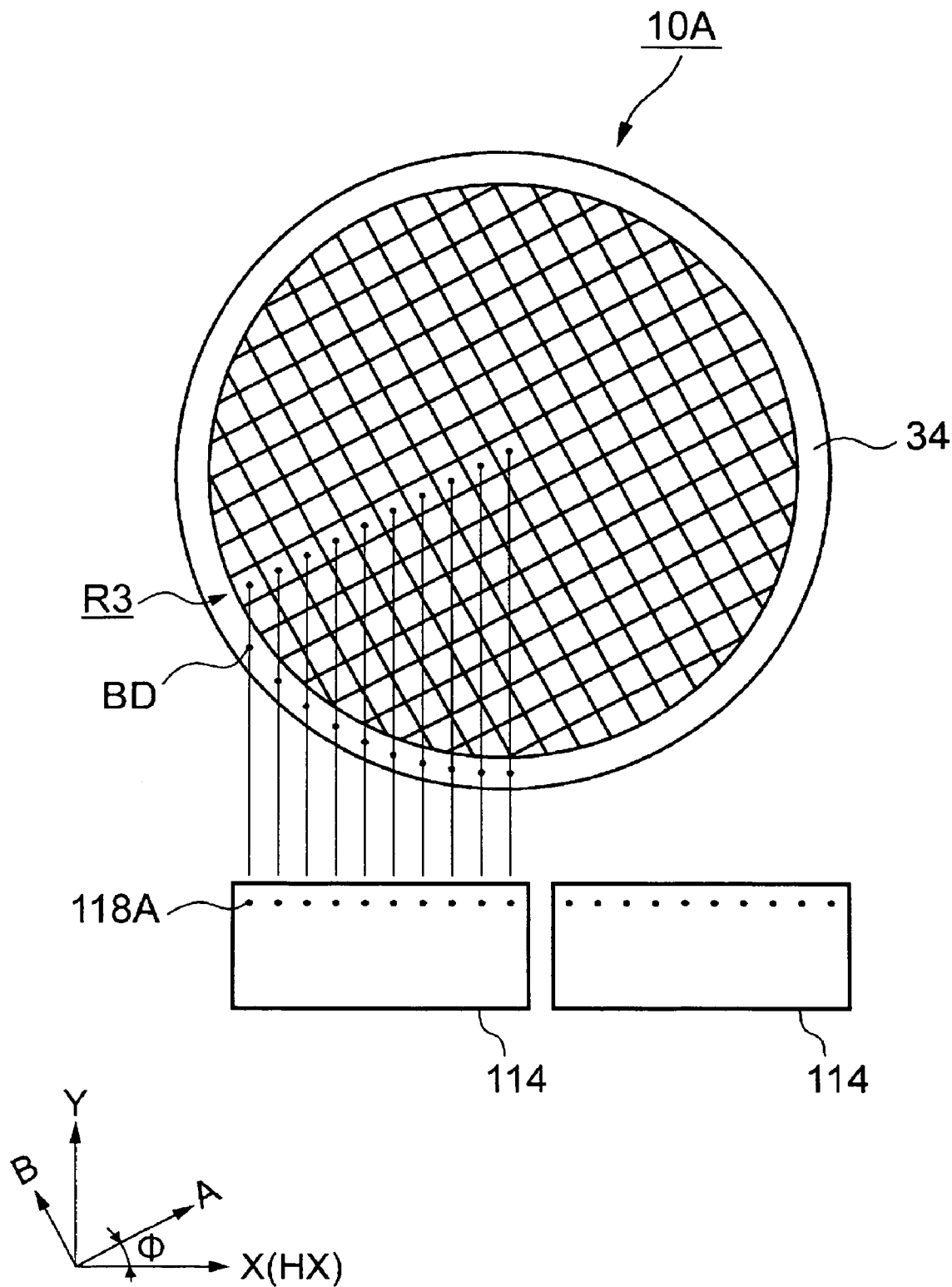
FIG. 14 is an exemplary schematic diagram showing inspection of nozzle condition and inspection of impact positions.

Prior to coat scanning for the section subject to ejection 18, inspection of the nozzle condition and inspection of the impact position will be carried out. First, the control 112 drives the scanner so that the head 114 may move relatively in the y-axis direction while the x-coordinate of the first nozzle 118A is kept in agreement with the x-coordinate of the section subject to ejection 18 in the column R3. Then, when the first nozzle 118A penetrates an area corresponding to the periphery 34 of the substrate 10A, the liquid optical material 111 is ejected from this first nozzle 118A to the periphery 34 of the substrate 10A. As shown in FIG. 14, the relative movement of the head 114 along the y-axis direction is continued until all the first nozzles 118A included in one nozzle row 116 eject the liquid optical material to the periphery 34 of the substrate 10A. FIG. 14 shows in black dots the impact positions BD of the liquid optical material 111 that impacted the periphery 34.

After the liquid optical material 111 is coated on the periphery 34 from all the first nozzles 118A, an operator inspects with a microscope and the like the optical material 111 on the periphery 34. Specifically, by checking the shape of a dot formed by the coated optical material 111, inspection of whether or not the surface of the substrate 10A (periphery 34) has a desired repellency is conducted. Since the FAS film 28 is formed on the surface of the substrate 10A, including the periphery 34 and the section subject to ejection 18, the repellency of the periphery 34 with respect to the optical material 111 is supposed to be the same as the repellency of the section subject to ejection 18 with respect to the optical material 111. Consequently, by checking the degree of repellency of the periphery 34, it is possible to estimate the degree of repellency of the section subject to ejection 18. If it is estimated that the degree of repellency of the section subject to ejection 18 is lower than the prescribed criterion, what is required is for the substrate 10A to be placed inside the surface quality improvement device 160 to carry out, once again, formation of the FAS film 28 on the surface of the substrate 10A.

Also, by checking the shape of a dot formed by the coated optical material 111, it is possible to confirm the ejection status from the first nozzles 118A. For example, as described below, it is possible to inspect whether the optical material 111 is deposited on the first nozzles 118A.

There may be a case where the optical material 111 is deposited inside the first nozzles 118 as the viscosity of the optical material 111 increases. In such a case, there is a possibility of not being able to eject the optical material 111 of the targeted volume. It is also possible for the optical material 111 to impact off the intended impact positions BD. As a result of checking the shape of a dot, if the shape of the dot formed by the coated optical material 111 is substantially the same as the prescribed shape, it may be deemed impossible for the optical material 111 to be deposited on the first nozzles 118A. On the other hand, if the shape of the dot formed by the coated optical material 111 is different from the prescribed shape, it is highly possible for the optical material 111 to be deposited on the first nozzles 118A.

In a case where the shape of the dot is different from the prescribed shape, what is required is to move the first nozzles 118A to a prescribed position outside the range of scanning and carry out flushing of the liquid optical material 111 from the first nozzles 118A. This is because such action would have a good possibility of removing the deposited optical material 111 from inside the first nozzles 118A. It should be noted that in the present specification, the above-mentioned flushing of the liquid optical material 111 may be denoted by preliminary ejection.

When the inspection is conducted by the operator, confirmation by detecting the position of a dot formed by the impacted optical material 111 with a CCD camera an the like, confirmation may be made of whether or not a gap between the two mutually adjacent dots in the x-axis direction and a distance between the two mutually adjacent sections subject to ejection 18 in the x-axis direction are in agreement. If the gap between the two mutually adjacent dots in the x-axis direction and the distance between the two mutually adjacent sections subject to ejection 18 in the x-axis direction are not in agreement, it may be deemed that the distance between the two mutually adjacent sections subject to ejection 18 in the x-axis direction are not in agreement with the distance between two first nozzles 118A arrayed in the x-axis direction. In this case, what is required is to turn the stage 106 again around the z-axis and correct the relative position of the stage 106 to the carriage 103.

After inspecting the nozzle condition and inspecting the impact position, the control 112 drives the scanner to enable the plurality of nozzles 118 to move relatively in the direction intersecting perpendicularly the nozzle row direction HX during one scanning period (the scanning period to be detailed later). Specifically, the control 112 drives the scanner to enable the carriage 103 to move relatively in the positive direction of the y-axis direction (upward direction of FIG. 10). Then, when one of the first nozzles 118A penetrates an area corresponding to one of the sections subject to ejection 18 in the column R3, the control 112 drives the head 114 so that the liquid optical material 111 is ejected from this first nozzle 118A to the section subject to ejection 18.

In the example, there are 60 first nozzles 118 in one nozzle row 116. As a result, during one scanning period, the 60 consecutive sections subject to ejection 18 along the a-axis direction out of the plurality of the sections subject to ejection 18 are coated by one nozzle row 116. After the optical material 111 of a proper volume is coated on these 60 sections subject to ejection 18, the control 112 drives the scanner so that the x-coordinates of the first nozzles 118A are in agreement with the x-coordinates of the sections subject to ejection 18 not coated with the liquid optical material 111 out of the sections subject to ejection 18 included in the column R3. And the carriage 103 is moved relatively to the y-axis direction, while the liquid optical material is ejected from the first nozzles 118A to the uncoated sections subject to ejection 18 in the column R3.

In the present specification, one scanning period can correspond to the following period in (1) or the period in (2): (1) a period from the time the carriage 103 starts moving relatively in the prescribed direction to the time a relative movement begins to a direction different from the prescribed direction; and (2) a period not corresponding to (1) above, and a period from the time the carriage 103 starts moving relatively in the prescribed direction to the time of beginning to complete the ejection process to the substrate 10A.

For example, a period from the time the carriage 103 starts moving relatively in the positive direction of the y-axis direction to the time of beginning to move relatively in the negative direction of the y-axis direction or in the positive (or negative) direction of the x-axis direction is one scanning period. Also, in a case where the carriage 103 is required to make relative movement in the y-axis direction only one time until the desired amount in volume of the optical material 111 is coated on all the plurality of the sections subject to ejection 18, the period for this one-time relative movement is the scanning period. Incidentally, there may possibly occur a case where during the one-time scanning period, after the carriage 103 makes relative movement in the prescribed direction, it stops with respect to the substrate 10A, whereafter the carriage 104 further makes relative movement in the same prescribed direction.

Also, the relative movement of the carriage 103, the head 114 or the nozzle 118 means that the relative positions of these with respect to the section subject to ejection 18 changes. Consequently, a case where the carriage 103, the head 114 or the nozzle 118 should remain absolutely stationary, while only the section subject to ejection 18R moves by stage 106, is described as the carriage 103, the head 114 or the nozzle 118 making relative movement.

Figure 11:
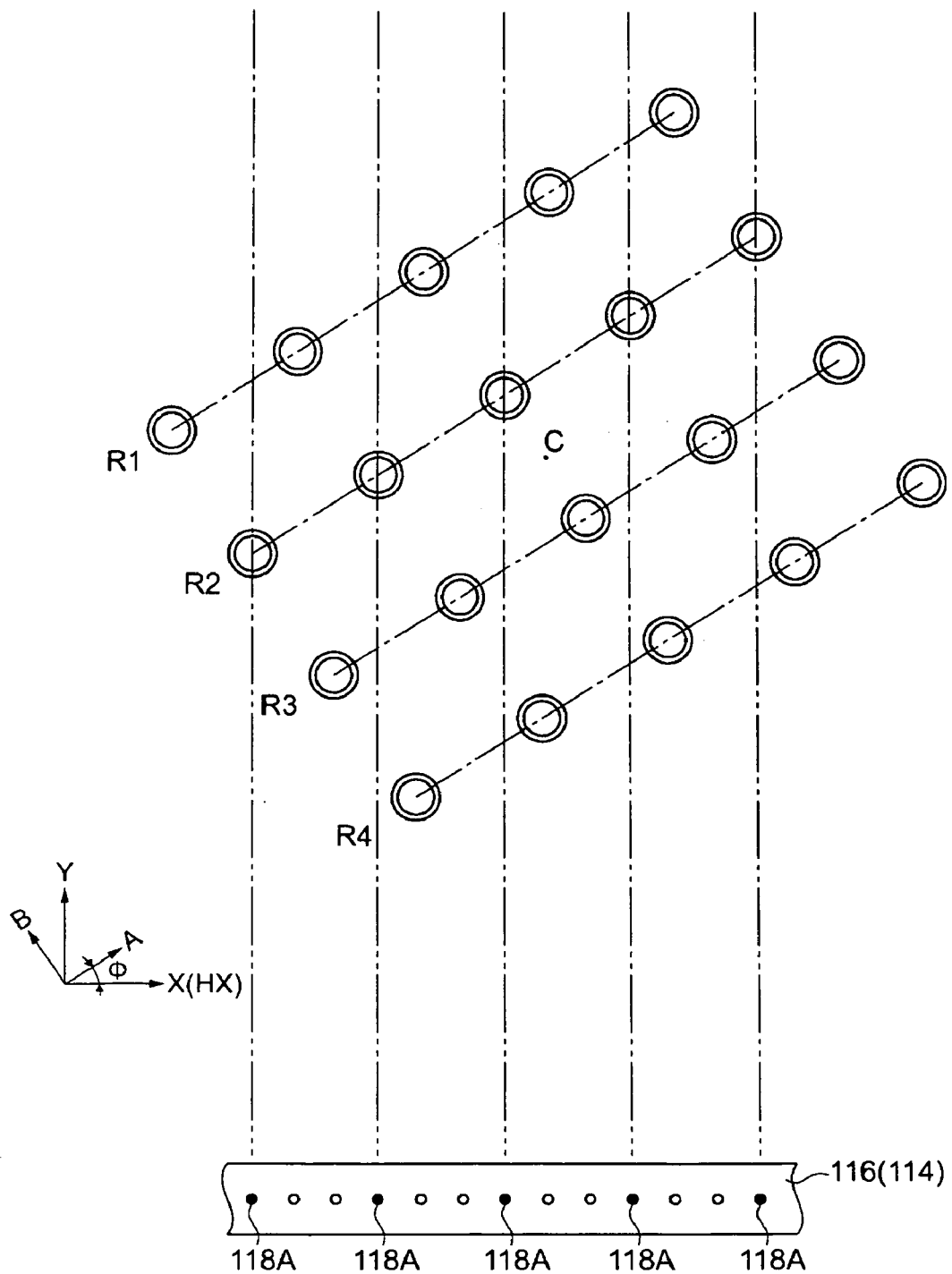
FIG. 11 is an exemplary schematic diagram showing an ejection process of Example 1.

After the desired amount in volume of the optical material 111 is coated on all the sections subject to ejection 18 in the column R3, the same coat scanning as for the column R3 is performed for the sections subject to ejection 18 in other columns. For example, as shown in FIG. 11, the control 112 drives the scanner so that the x-coordinate of each of the first nozzles 118A is in agreement with the x-coordinate of each of the sections subject to ejection 18 included in the column R2.

And the ejection device 100 performs the same coat scanning for the sections subject to ejection 18 included in the column R2 as the coat scanning carried out for the sections subject to ejection 18 included in the column R3. In this manner, by performing coat scanning for the sections subject to ejection 18 included in all columns, the liquid optical material 111 is coated on all the sections subject to ejection 18 on the substrate 10A.

Figure 15:
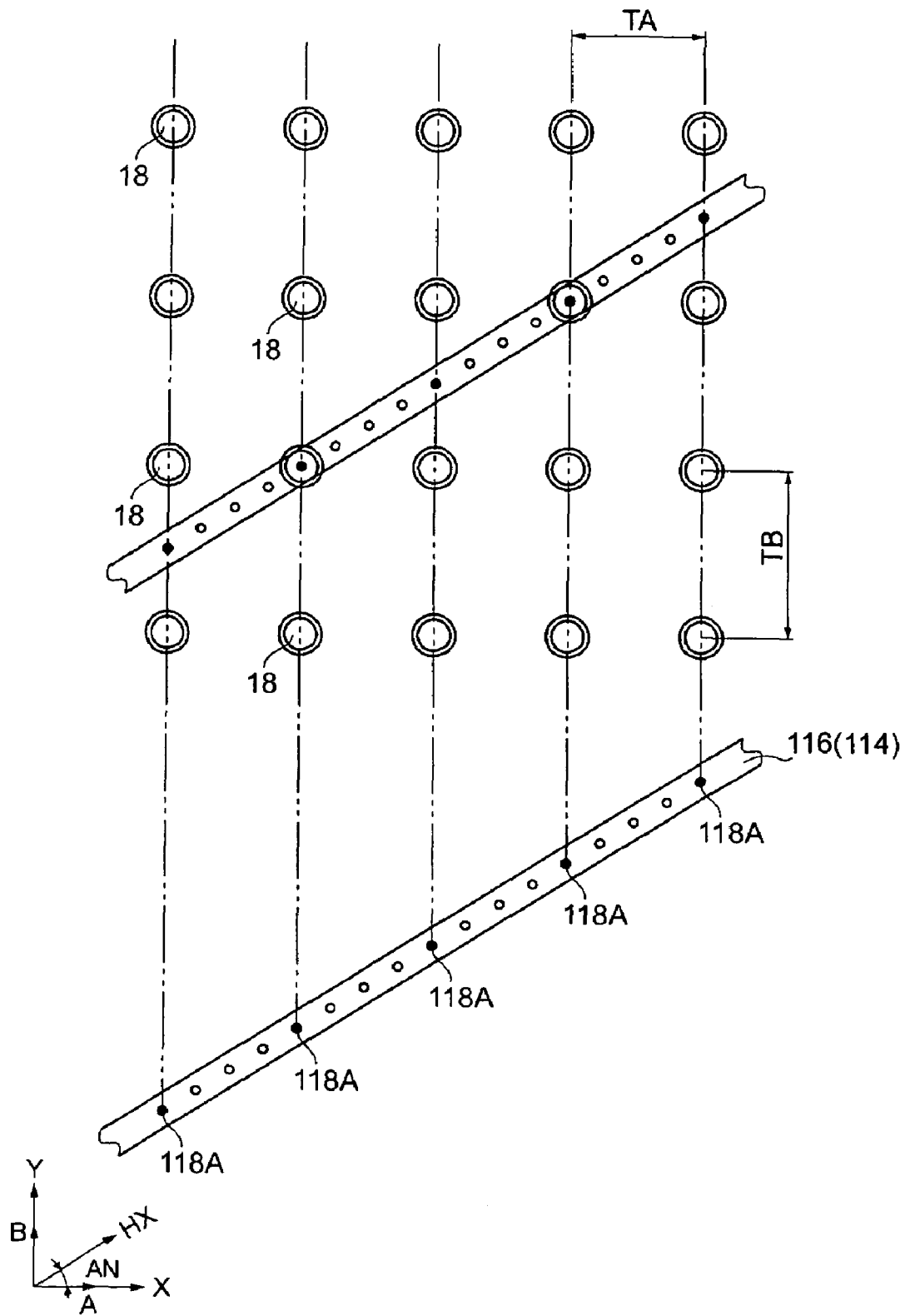
FIG. 15 is an exemplary schematic diagram showing a positional relationship between a nozzle row direction and a section subject to ejection in case a head is tilted.

According to the example, the stage 106 rotates so that a distance in the x-axis direction between the two mutually adjacent sections subject to ejection 18 and a distance between the two first nozzles 118A may be in agreement. For this purpose, it is possible to perform coat scanning to all the sections subject to ejection 18 on the substrate 10A while the nozzle column direction HX, that is, a direction in which a plurality of nozzles 118 are lined in a single row, is maintained in a direction intersecting the x-axis direction perpendicularly On the other hand, as shown in FIG. 15, when the two mutually adjacent sections subject to ejection 18 are made to agree with the distance between the two first nozzles 118A by changing the direction of the nozzle row direction HX, it is necessary to set respective angles of a plurality of heads 114 (FIG. 5) properly with respect to the carriage 103. According to such configuration, if a distance in the a-axis direction between the two mutually adjacent sections subject to ejection 18 varies per substrate 10A, there is created a step of changing respective angles of attaching a plurality of heads 114 per substrate 10A. The head 114 is affixed with a screw on the carrier 103, hence, the step of changing the angle takes a length of time that cannot be ignored. Further, considerable work is required to fit respective angles of the plurality of heads 114 to a specified angle. Consequently, when tilting the angle of the head 114, it takes long time for preparation prior to the ejection process.

Nonetheless, according to the present example, it is possible to maintain the nozzle row direction HX, that is, the main scanning direction, in a direction intersecting thereto perpendicularly at all times. Consequently, even if the distance in the a-axis direction between the two mutually adjacent sections subject to ejection 18 varies per substrate 10A, it is not necessary to change any angle of the plurality of heads 114.

According to the ejection method of the present example, a timing for one first nozzle 118A to carry out ejection and the number of other first nozzles 118A carrying out ejection at substantially the same timing are constant at all times (0 in the case of the present example). As a result, crosstalk received by one first nozzle 118A from other first nozzles 118A is substantially the same over the entire ejection timing of the one first nozzle 118A. If the crosstalk is roughly constant, discrepancy from the ideal value of the ejection amount from the first nozzle 118A is also in agreement. Hence, according to the ejection method of the present example, the ejection amount may be easily corrected. It should be noted that crosstalk as mentioned herein means a defect in ejection generated as vibration of the piezo-electric element 124 corresponding to one nozzle 118 causes a meniscus of a material in other nozzles 118 to vibrate.

In the example, the volume of the liquid optical material 111 ejected from one nozzle 118 in one-time ejection is approximately 4 pl (picoliter). Also, in the present example, the liquid optical material 111 is ejected a plurality of times, for example, 15 times, to one section subject to ejection 18. Further, in the present example, the ejection device 100 ejects the optical material one time per scanning period to one section subject to ejection 18. As a result, in the example, until coating the optical material 111 in the desired amount to one section subject to ejection 18, all that is required of the ejection device 100 to spend is 15 scanning periods. It should be noted that the volume ejected by one-time ejection and the ejection number of times may be altered as necessary, depending on the nature of the optical material 111 as well as the target shape of the micro lens 111L.

The shape of the upper surface of the section subject to ejection 18, that is, the shape of the upper surface of the base part 30, is approximately circular. Consequently, when ejecting the liquid optical material 111 from the first nozzle 118A, it is preferable to eject a droplet of the optical materials roughly aiming always at the center of the circular section subject to ejection 18.

As described above, because the surface of the base part 30 is the FAS film 28, the section subject to ejection 18 (base part 30) has repellency with respect to the liquid optical material 111. Inasmuch as the shape of the section subject to ejection 18 has repellency with respect to the liquid optical material 111 and the shape of the section subject to ejection 18 is approximately circular, the liquid optical material that impacted assumes a convex lens whose thickness is the thickest approximately in the vicinity of the center of the section subject to ejection 18.

E: Manufacturing Method

In the foregoing Section D: Ejection Method, the ejection process of coating the liquid optical material 111, which is the material of the micro lens 111L, on the section subject to ejection 18 on the substrate 10A has been described. A series of steps up to formation of the micro lens 111L will be described below.

Figure 12A:
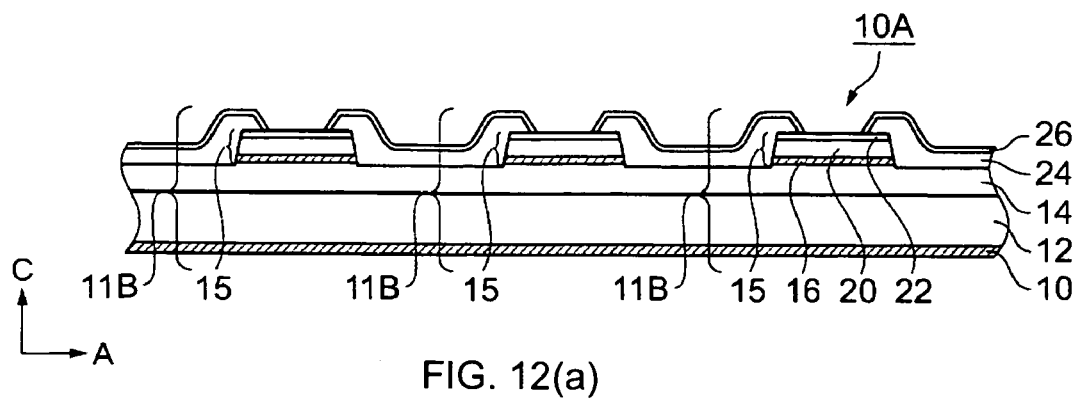
FIGS. 12a-b are exemplary schematic diagrams showing a fabrication method of Example 1.

First, an array of laser elements 11B shown in FIG. 12 a will be fabricated by using a semiconductor wafer. Specifically, on an n-type gallium arsenic (GaAs) wafer 12', there are alternately stacked the $Al_{0.15}Ga_{0.85}As$ and the AlAs to form the lower part distribution reflective multi-layer film mirror (lower DBR mirror) 14 on which Se was doped. And on the lower part distribution reflective multi-layer film mirror (lower DBR mirror), there are stacked the GaAl layer and the $Al_{0.3}Ga_{0.7}As$ layer to form the quantum well active layer 16. Then, on the quantum well active layer 16, there are alternately stacked the $Al_{0.15}Ga_{0.85}As$ layer and the $Al_{0.9}Ga_{0.1}As$ layer to form the upper part distribution reflective multi-layer film mirror (upper DBR mirror) 20 on which Zn was doped. Thereafter, on the upper part distribution reflective multi-layer film mirror 20, there is stacked a contact layer 22 including the $Al_{0.15}Ga_{0.85}As$ layer.

And part of the lower DBR mirror 14, the quantum well active layer 16, the upper DBR mirror 20, and the contact layer 22 are removed by processing with photolithography so that a plurality of regions including the upper DBR mirror 20, the quantum well active layer 16, and part of the lower DBR mirror 14 may remain as the mesa-shaped columnar part 15.

And a resin layer is formed by covering the lower DBR mirror 14 and the columnar part 15 and coating a resin such as polyimide. Subsequently, to obtain an opening part at a section corresponding to the upper surface of the contact layer 22, the resin layer is subjected to patterning, thus obtaining the insulating layer 24. Then, on the insulating layer 24, there are stacked titanium, platinum, and gold in sequence. Thereafter, the stacked titanium, platinum, and gold are subjected to patterning, so that the stacked titanium, platinum, and gold as well as the contact layer 22 may be connected in a ring shape. Lastly, an electrode is provided on the reverse surface of the gallium arsenic wafer 12', thus forming a lower electrode 10.

In the manner described above, as shown in FIG. 12a, a substrate 10A equipped with a plurality of laser elements 11B is completed.

Figure 12B:
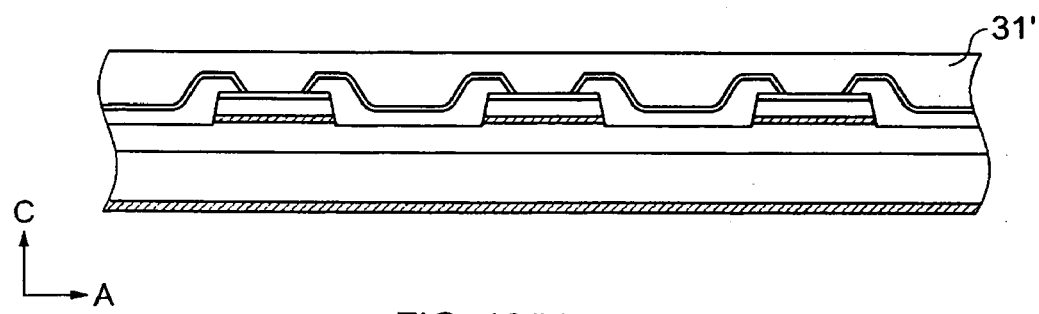
Figure 12C:
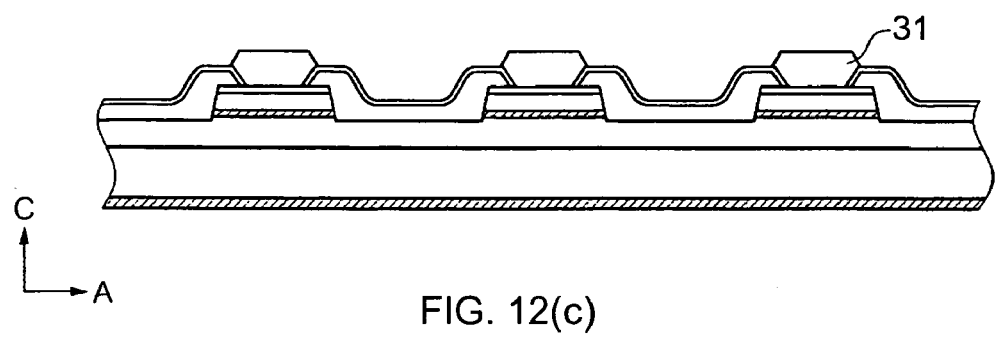

Next, as shown in FIG. 12b, a support 31 is formed on a part corresponding to the columnar part 15 of the substrate 10B. Specifically, by coating polyimide as if covering the upper surface of the contact layer 22, the insulating layer 24, and the upper electrode 26, a polyimide layer 31' is formed. Then, as shown in FIG. 12c, the polyimide layer 31' is subjected to patterning so that a portion of the polyimide layer 31' corresponding to the contact layer 22 may remain, thus obtaining a plurality of supports 31.

Figure 13A:
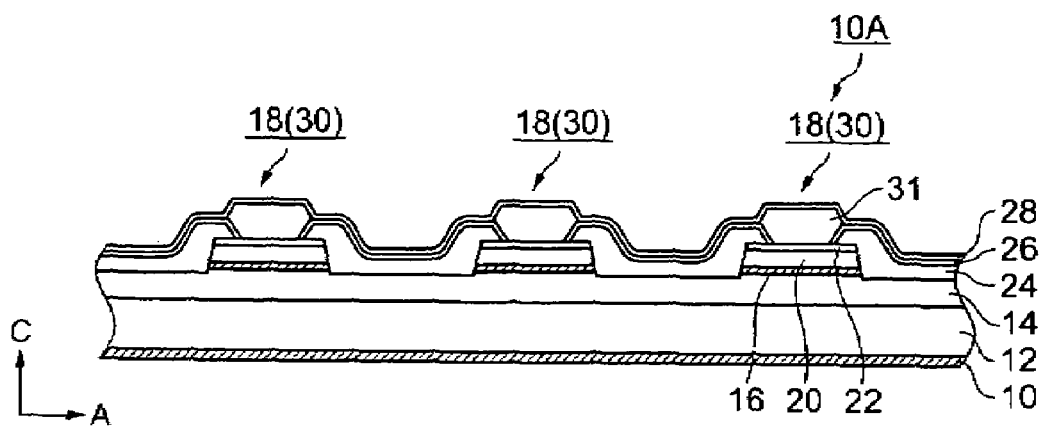
FIGS. 13a-b are exemplary schematic diagrams showing a fabrication method of Example 1.

Thereafter, as shown in FIG. 13a, the surface of the support 31 is treated with a repellent. Specifically, first, the surface of the substrate 10A including the surface of the support 31 is cleaned by irradiating an ultraviolet ray on the surface of the substrate 10A. And the fluoro-alkylsilane (FAS) film 28 is formed on the surface of the support 31. More specifically, the conveying unit 170 positions the substrate 10A inside a hermetically sealed vessel in the surface quality improvement device 160. In this hermetically sealed vessel, there is a container with liquid FAS. When it is kept at 120° C. inside such hermetically sealed vessel, in about 2 hours, a monomolecular film of FAS is formed on the surface of the substrate 10A through vaporized FAS. At this time, a monomolecular film of FAS is also formed on the surface of the support 31.

In the present example, each of the plurality of supports 31 on which the FAS film is formed corresponds to each of the plurality of base parts 30. It should be understood that if the surface of the support 31 shows sufficient repellency to the liquid optical material even without the FAS film 28, the base part 30 does not need to include the FAS film 28.

In the above-mentioned manner, the plurality of base parts 30 are set up on the substrate 10A. Namely, the substrate 10A having the plurality of base parts 30 is obtained. It should be noted that as mentioned above, in the present specification, each of the plurality of base parts 30 corresponds to each of the plurality of sections subject to ejection 18.

Figure 13B:
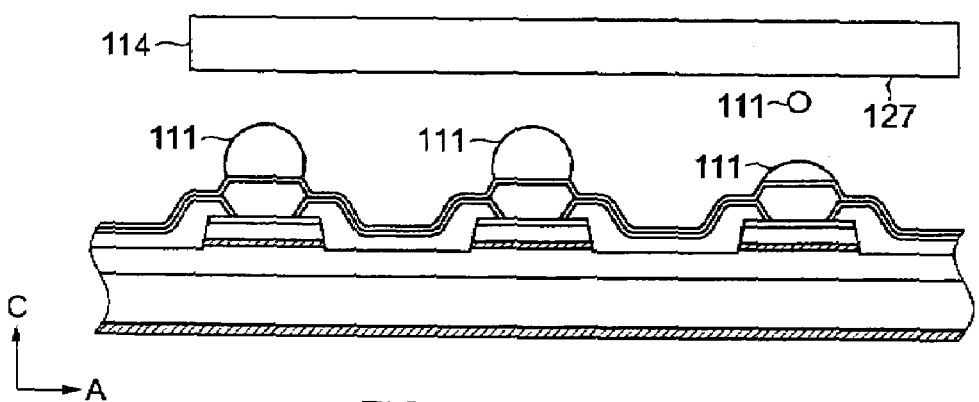

Next, the liquid optical material 111 is ejected to each of the plurality of sections subject to ejection 18. Specifically, first, the substrate 10A having the plurality of sections subject to ejection 18 is conveyed by the conveying unit 170 to the stage 106 of the ejection device 100. Then, as shown in FIG. 13B, the liquid optical material 111 is ejected from the first nozzle 118A of the head 114 in a manner of coating the liquid optical material 111 on all the plurality of sections subject to ejection 18. An ejection method of the optical material 111 of the ejection device 100 is the method described with reference to FIG. 9, FIG. 10, and FIG. 11.

After the optical material 111 is coated on all the sections subject to ejection 18 of the substrate 10A, the liquid optical material 111 on the sections subject to ejection 18 is hardened. Specifically, first, the conveying unit 170 positions the substrate 10A inside the polymerization unit 150. Then, the polymerization unit 150 polymerizes, that is, hardens the optical material 111 by irradiating light of a wavelength of approximately 365 nm on the optical material on the sections subject to ejection 18.

Figure 13C:
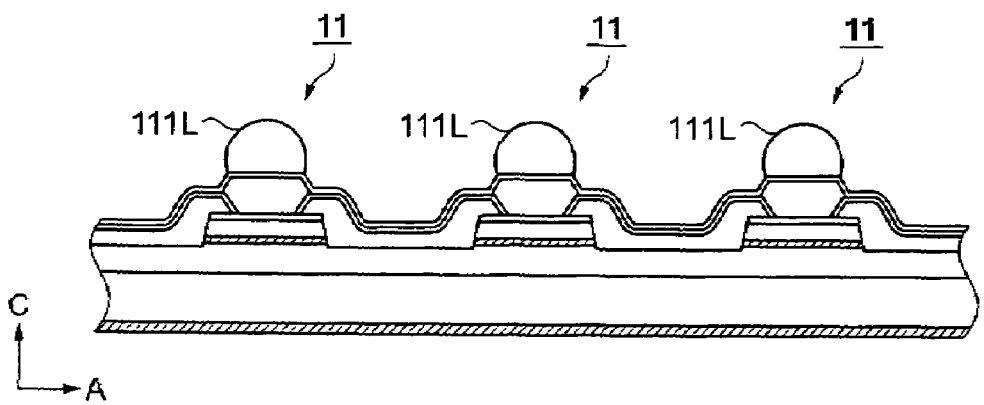

After the optical material 111 is polymerized or hardened, the conveying unit 170 positions the substrate 10A inside the hardening unit 165 and the hardening unit 165 heats the entire substrate 10A by using a hot plate, so that all the optical material 111 on the sections subject to ejection 18 are completely hardened. As a result, as shown in FIG. 13 C, the micro lens 111L is obtained on all sections subject to ejection 18.

By the foregoing process, the laser 11 shown in FIG. 1 can be obtained.

An optical device equipped with the laser 11 will be described below.

Figure 16:
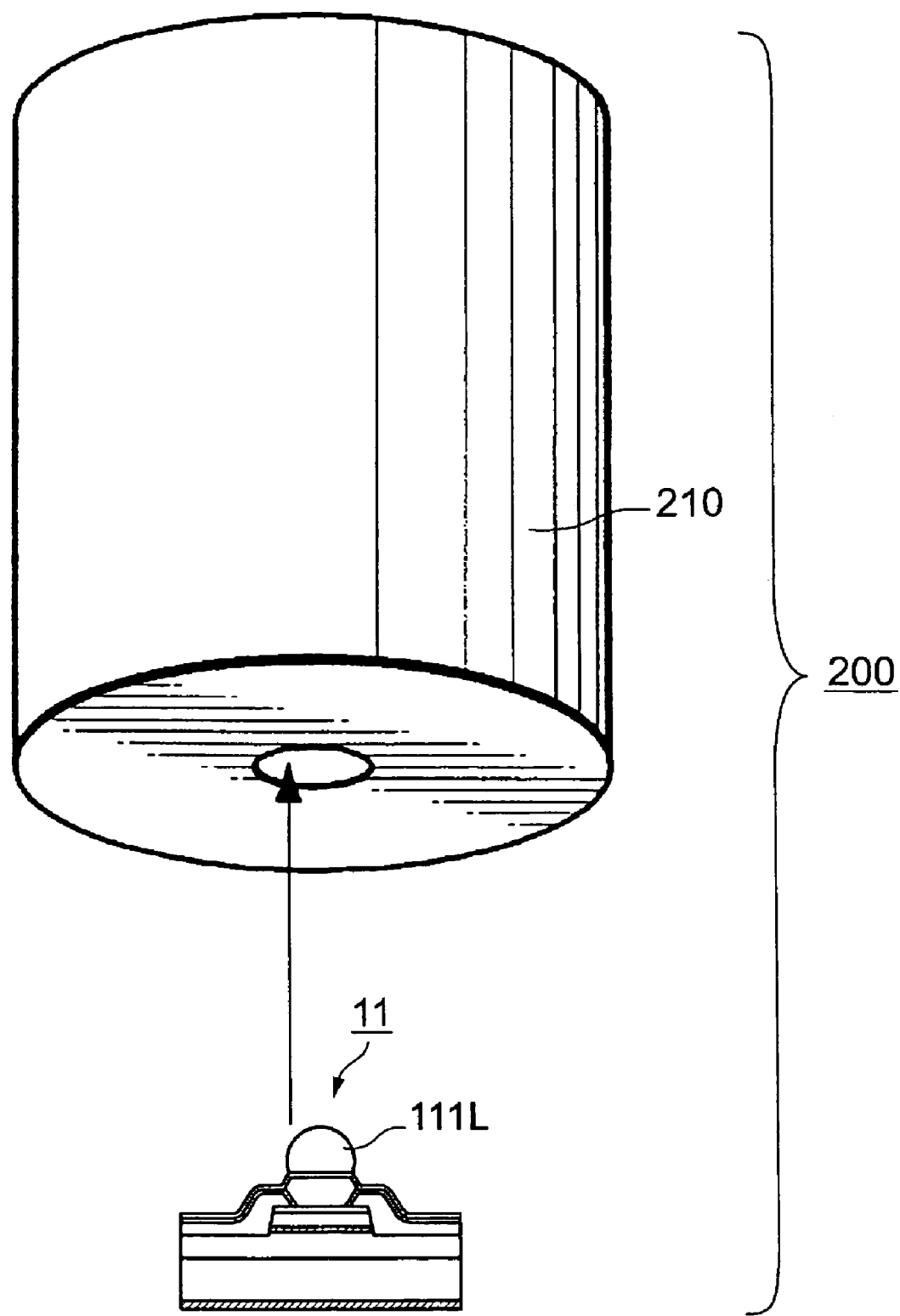
FIG. 16 is an exemplary schematic diagram showing an optical device.

The optical device 200 shown in FIG. 16 is a light-emitting device module used in an optical communications system. The optical device 200 includes an optical fiber 210 and the laser 11. The laser 11 functions as a light-emitting device in the optical device 200. The laser 11 and the optical fiber 210 are positioned such that the ends of the micro lens 111L of the laser 11 and the optical fiber 210 face each other. Specifically, the laser 11 and the optical fiber 210 are positioned by a light-emitting device mounted substrate which is unillustrated, so that the optical axis of the laser 11 meets the optical axis of the optical fiber. Since such optical device 200 has the laser 11 which is equipped with the micro lens 111L, light emitted from the laser 11 is efficiently guided into a fiber core of the optical fiber 210. Consequently, a transmission distance of light becomes long.

The ejection method described in the example may be applied to a manufacturing method of a lens provided at each pixel region of a display equipped with a plurality of pixel regions. This is because if the plurality of pixel regions are arrayed at a prescribed interval in the axis direction and in the b-axis direction, each pixel region may be deemed as a plurality of the sections subject to ejection 18 to form a lens. As the displays equipped with a plurality of pixel regions, there are image displays such as a liquid crystal display, an electro-luminescence display, an FED (Field Emission Display), and an SED (Surface-Conduction Electron-Emitter Display).

In the example, the section subject to ejection 18 is the base part 30 formed at a position overlapping the columnar part 15, that is, a laser resonator. However, even if the base part 30 is not provided at a position overlapping the columnar 15, the present invention may be applicable. For example, treating a plurality of base parts 30 provided on a plain substrate as the sections subject to ejection 18, a lens may be formed by the ejection method described in the above example. In such a case, after a lens is formed on the section subject to ejection 18, the lens is removed from the section subject to ejection 18 and set up on a pixel region of the above display.

In a case where a plurality of scanning periods are needed until the optical material 111 in a desired amount is coated on one section subject to ejection 18, the optical material 111 may be ejected from the same first nozzle 118A to one section subject to ejection 18 during a plurality of scanning periods, or the optical material 111 may be ejected from a different first nozzle 118A to one section subject to ejection 18 per scanning period.

In a case of ejecting the optical material 111 from a different first nozzle 118A to one section subject to ejection 18 per scanning period, scattering of the ejection amount between nozzles 118 tends to be offset. Consequently, when making a plurality of micro lenses, there is a decrease in shape scattering among completed micro lenses.

Allocation of first nozzles 118A with respect to a plurality of nozzles 118 may be changed per scanning period. For example, the nozzle 118 designated as the second nozzle 118B during one scanning period, may function as the first nozzle 118A during another scanning period. This tends to offset scattering of the ejection amounts among the nozzles 118, hence, preferable.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An ejection method, comprising:

positioning a substrate having two sections subject to ejection so that a distance in an x-axis direction between the two sections subject to ejection and a gap between any two nozzles of a plurality of nozzles arranged in the x-axis direction are in agreement;

moving the plurality of nozzles along a y-axis direction intersecting perpendicularly the x-axis direction relative to the substrate; and ejecting a liquid material respectively from the two nozzles to the two sections subject to ejection if the two nozzles should respectively penetrate areas corresponding to the two sections subject to ejection.

2. The ejection method according to claim 1, the positioning step including a step of placing the substrate on a stage and a step of positioning the substrate relative to the plurality of nozzles by rotating the stage.

3. The ejection method according to claim 1, the positioning step including a step of putting x-coordinates of the two nozzles in agreement with x-coordinates of the two sections subject to ejection.

4. A lens manufacturing method, comprising:

positioning a substrate having two sections subject to ejection so that a distance in an x-axis direction between the two sections subject to ejection and a gap between any two nozzles of a plurality of nozzles arranged in the x-axis direction are in agreement;

moving the plurality of nozzles along a y-axis direction intersecting perpendicularly the x-axis direction relative to the substrate;

ejecting a liquid material respectively from the two nozzles to the two sections subject to ejection if the two nozzles should respectively penetrate areas corresponding to the two sections subject to ejection; and hardening the liquid material.

5. The lens manufacturing method according to claim 4, the positioning step including a step of placing the substrate on a stage and a step of positioning the substrate relative to the plurality of nozzles by rotating the stage.

6. The lens manufacturing method according to claim 4, the positioning step including a step of putting x-coordinates of the two nozzles in agreement with x-coordinates of the two sections subject to ejection.

7. A fabrication method of a semiconductor laser, comprising:

positioning a substrate having two sections subject to ejection so that a distance in an x-axis direction between the two sections subject to ejection and a gap between any two nozzles of a plurality of nozzles arranged in the x-axis direction are in agreement, each of the two sections subject to ejection covering a light-emitting surface of a laser element and the substrate being provided with the laser element;

moving the plurality of nozzles along a y-axis direction intersecting perpendicularly the x-axis direction relative to the substrate; and ejecting a liquid material respectively from the two nozzles to the two sections subject to ejection if the two nozzles should respectively penetrate areas corresponding to the two sections subject to ejection.

8. The fabrication method of a semiconductor laser according to claim 7, the positioning step including a step of placing the substrate on a stage and a step of positioning the substrate relative to the plurality of nozzles by rotating the stage.

9. The fabrication method of a semiconductor laser according to claim 7, the positioning step including a step of putting x-coordinates of the two nozzles in agreement with x-coordinates of the two sections subject to ejection.

* * * * *